United States Patent
Seong et al.

(10) Patent No.: US 8,961,835 B2
(45) Date of Patent: Feb. 24, 2015

(54) CONDUCTIVE METAL INK COMPOSITION AND METHOD FOR FORMING A CONDUCTIVE PATTERN

(71) Applicant: LG Chem, Ltd., Seoul (KR)

(72) Inventors: Jie-Hyun Seong, Daejeon (KR); Soo-Yeon Heo, Daejeon (KR); Jong-Taik Lee, Daejeon (KR); Kyoung-Su Jeon, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/199,532

(22) Filed: Mar. 6, 2014

(65) Prior Publication Data

US 2014/0186525 A1    Jul. 3, 2014

Related U.S. Application Data

(62) Division of application No. 13/392,260, filed as application No. PCT/KR2010/005651 on Aug. 24, 2010, now Pat. No. 8,691,118.

(30) Foreign Application Priority Data

Aug. 26, 2009   (KR) ........................ 10-2009-0079361
Aug. 24, 2010   (KR) ........................ 10-2010-0081974

(51) Int. Cl.
| | |
|---|---|
| *H01B 1/02* | (2006.01) |
| *H01B 1/08* | (2006.01) |
| *B05D 5/12* | (2006.01) |
| *H05K 3/12* | (2006.01) |
| *H01B 1/22* | (2006.01) |

(52) U.S. Cl.
CPC ................ *H05K 3/1275* (2013.01); *H01B 1/22* (2013.01); *H05K 3/1291* (2013.01)
USPC .......................... 252/512; 252/518.1; 427/123

(58) Field of Classification Search
None
See application file for complete search history.

(56) References Cited

U.S. PATENT DOCUMENTS

| 4,853,036 A | 8/1989 | Koike et al. |
|---|---|---|
| 2008/0173615 A1 | 7/2008 | Kim |
| 2008/0206488 A1 | 8/2008 | Chung et al. |
| 2008/0241391 A1 | 10/2008 | Kim et al. |
| 2008/0241414 A1 | 10/2008 | Kim et al. |
| 2009/0008142 A1 | 1/2009 | Shimizu et al. |

(Continued)

FOREIGN PATENT DOCUMENTS

| JP | 2005-060700 | 3/2005 |
|---|---|---|
| JP | 2006-147202 | 6/2006 |

(Continued)

*Primary Examiner* — Harold Pyon
*Assistant Examiner* — Jaison Thomas
(74) *Attorney, Agent, or Firm* — McKenna Long & Aldridge, LLP (57) ABSTRACT

The present invention relates to a conductive metal ink composition which is properly applied for roll-printing process to form conductive pattern with improved conductivity, and the method of preparing a conductive pattern using the same.

The conductive metal ink composition comprises a conductive metal powder; an organic silver complex where an organic ligand including amine group and hydroxyl group binds with a silver (Ag) salt of aliphatic carboxylic acid; a non-aqueous solvent comprising a first non-aqueous solvent having a vapor pressure of 3 torr or lower at 25° C. and a second non-aqueous solvent having a vapor pressure of higher than 3 torr at 25° C.; and a coatability improving polymer.

2 Claims, 2 Drawing Sheets

(56) References Cited

U.S. PATENT DOCUMENTS

| | | |
|---|---|---|
| 2010/0021704 A1 | 1/2010 | Yoon et al. |
| 2010/0065786 A1* | 3/2010 | Simons .................. 252/506 |
| 2010/0148131 A1 | 6/2010 | Kotake et al. |
| 2013/0236656 A1 | 9/2013 | McCullough et al. |

FOREIGN PATENT DOCUMENTS

| | | |
|---|---|---|
| KR | 10-2006-0017686 | 2/2006 |
| KR | 10-2006-0112025 | 10/2006 |
| KR | 10-2006-0130568 | 12/2006 |
| KR | 10-2008-0029826 | 4/2008 |
| KR | 10-2008-0088712 | 10/2008 |
| TW | 200800609 | 2/1996 |
| WO | 2008038976 | 4/2008 |
| WO | 2008111484 | 9/2008 |

* cited by examiner

CONDUCTIVE METAL INK COMPOSITION AND METHOD FOR FORMING A CONDUCTIVE PATTERN

This application is a divisional application of Ser. No. 13/392,260, filed Feb. 24, 2012, which is the National Phase application of International Application No. PCT/KR2010/005651 filed on Aug. 24, 2010, which claims the benefit of Korean Patent Application Nos. 10-2009-0079361, filed on Aug. 26, 2009, and 10-2010-0081974, filed on Aug. 24, 2010, which are hereby incorporated by reference for all purposes as if fully set forth herein.

TECHNICAL FIELD

The present invention provides a conductive metal ink composition and a method for forming a conductive pattern. More specifically, the present invention provides the conductive metal ink composition which is properly applied for roll-printing process to form conductive pattern with improved conductivity, and the method of preparing a conductive pattern using the same.

BACKGROUND ART

Recently, various flat panel display devices have been used widely. To manufacture the flat panel display device, many conductive patterns such as electrode, wiring, and EMI-shield filter are formed on a substrate, usually by photolithography.

However, the pattern formation by photolithography requires many steps of coating of photosensitive material, exposing, developing, etching and etc., thereby making the entire process be complex and expensive.

Therefore, there are increasing focuses on the method of preparing the conductive pattern using inkjet printing method, roll printing method and etc. Particularly, the roll printing method attracts more attention, because it has an advantage in making the fine conductive pattern which is very difficult to form by using the inkjet printing method. In order that good conductive pattern is obtained by using the roll printing method, the conductive ink composition to be used must have proper properties such as a low initial viscosity to be well coated on the roller, and a property being satisfactorily transferred to the substrate in a desired pattern.

However, a conductive ink composition which is satisfactory enough to form a fine conductive pattern by the roll printing method cannot be developed as yet. Moreover, in case that the previously-developed conductive ink composition having a low initial viscosity is used, the conductivity of conductive pattern is not sufficient enough. Thus, there is still need for conductive ink composition with excellent properties being capable of forming fine conductive pattern.

DISCLOSURE

Technical Problem

The present invention provides a conductive metal ink composition which is properly applied for a roll printing process to form conductive pattern with improved conductivity, and a method of preparing a conductive pattern.

In addition, the present invention provides a method of preparing a conductive pattern by using the conductive metal ink composition.

Technical Solution

The present invention provides a conductive metal ink composition comprising a conductive metal powder; an organic silver complex where an organic ligand including amine group and hydroxyl group binds with a silver (Ag) salt of aliphatic carboxylic acid; a non-aqueous solvent comprising a first non-aqueous solvent having a vapor pressure of 3 torr or lower at 25° C. and a second non-aqueous solvent having a vapor pressure of higher than 3 torr at 25° C.; and a coatability improving polymer.

The present invention provides also a method of forming a conductive pattern, comprising the steps of:
coating a conductive metal ink composition on a roller;
forming a pattern of the ink composition corresponding to the conductive pattern on the roller, by contacting the roller with a printing cliché which has intaglio pattern corresponding to the conductive pattern;
transferring the pattern of the ink composition on the roller onto a substrate; and
sintering the transferred pattern on the substrate.

The conductive metal ink composition and the method of preparing conductive pattern using the same according to the present invention will be described in more detail.

In accordance with an embodiment, there is provided a conductive metal ink composition comprising a conductive metal powder; an organic silver complex where an organic ligand including amine group and hydroxyl group binds with a silver (Ag) salt of aliphatic carboxylic acid; a non-aqueous solvent comprising a first non-aqueous solvent having a vapor pressure of 3 torr or lower at 25° C. and a second non-aqueous solvent having a vapor pressure of higher than 3 torr at 25° C.; and a coatability improving polymer.

The conductive metal ink composition includes as a media the first non-aqueous solvent and the second non-aqueous solvent, which have different vapor pressure at room temperature. The first and the second non-aqueous solvents show different volatile properties due to the different vapor pressure, and particularly, the second non-aqueous solvent has higher vapor pressure and volatile property than those of the first non-aqueous solvent at room temperature. Therefore, the conductive metal ink composition including the first and the second non-aqueous solvents shows low viscosity and maintains uniform composition in the media including the including the first and the second non-aqueous solvents for a storage time, until it is coated on the roller in the roll printing process. Thus, the conductive metal ink composition can be easily coated on the roller uniformly.

In addition, when the conductive metal ink composition is exposed to air, the second non-aqueous solvent begins to volatilize shortly after the exposure due to its high volatility, and thus the viscosity of the composition gets higher sharply in several minutes. The ink composition coated on the roller can be easily patterned as the desired patterning shape. In addition, even after patterning, the ink composition cannot run down from the roller, and can maintain the good pattern shape.

Accordingly, if the roll printing is performed by using the conductive metal ink composition, the desired pattern can be transferred to the substrate with maintaining the good pattern shape and fine conductive pattern can be satisfactorily formed.

The conductive metal ink composition comprises an organic silver complex which is formed by binding an organic ligand including amine group and hydroxyl group to a silver (Ag) salt of aliphatic carboxylic acid. The example of organic silver complex is one described in KR 2008-0029826A, and the organic silver complex has a high solubility in solvent, maintains liquid-phase at room temperature, and shows an excellent stability in the ink composition without additional dispersing agent. That is, the organic silver complex can act as a kind of medium, and includes silver in itself. Inclusion of the organic silver complex in the conductive metal ink composition make it possible to decrease an amount of non-aqueous solvent in the ink composition and to contain more amount of conductive metal component such as silver (Ag) or other conductive powder. Therefore, the conductive metal ink composition includes the organic silver complex together with the conductive metal powder, thereby causing the improved conductivity of the conductive metal ink composition.

Hereinafter, each component of the conductive metal ink composition according to an embodiment of the present invention will be described in detail.

Firstly, the conductive metal powder is contained in the ink composition as a basic component to give the conductivity. The conductive metal powder can be any metal powder with electrical conductivity and for examples, includes at least one selected from the group consisting of silver (Ag), copper (Cu), gold (Au), chrome (Cr), aluminum (Al), tungsten (W), zinc (Zn), nickel (Ni), iron (Fe), platinum (Pt) and lead (Pb). In order that the conductive pattern prepared from the ink composition shows excellent and uniform conductivity due to the uniform distribution of the metal powder, the metal powder have an average particle diameter of nano-scale. For example, the average diameter of the metal powder can be about 1 to 100 nm, preferably about 5 to 70 nm, or more preferably about 10 to 50 nm.

The conductive metal powder can be contained at an amount of about 15 to 30 wt %, preferably about 20 to 30 wt %, or more preferably about 23 to 30 wt %, on the basis of total weight of other components in the composition except for the organic silver complex, where the total weight of other components are sum of the weights of conductive metal powder, the first non-aqueous solvent, the second non-aqueous solvent, the coatability improving polymer, and optionally the surfactant. If the amount of conductive metal powder is excessively small, the conductivity of conductive pattern formed from ink composition may be not sufficient. On the other hand, if it exceeds the amount, the poor property of the conductive pattern or the non-uniform coating of the composition can be obtained due to the poor distribution of the metal powder in the ink composition.

The conductive metal ink composition includes the first non-aqueous solvent and the second non-aqueous solvent. The first non-aqueous solvent has a vapor pressure of 3 torr or lower at 25° C. and a relatively low volatility, and acts a dispersing agent before sintering.

The first non-aqueous solvent can be any solvent having a vapor pressure of 3 torr or lower at 25° C., and the examples of first non-aqueous solvent are at least one or two volatile solvents selected from the group consisting of alcohol-based solvent, glycol-based solvent, polyol-based solvent, glycol ether-based solvent, glycol ether ester-based solvent, ketone-based solvent, hydrocarbon-based solvent, lactate-based solvent, ester-based solvent, aprotic sulfoxide-based solvent, and nitrile-based solvent, which have a vapor pressure of 3 torr or lower at 25° C. The specific examples of the first non-aqueous solvent are ethylene glycol, propylene glycol, glycerol, propylene glycol propylether, ethylene glycol monophenylether, ethylene glycol monoisopropylether, propyleneglycol monobutylether, diethylene glycol monobutylether, diethylene glycol monobutylether acetate, diethylene glycol ethylether, N-methylpyrrolidone, hexadecan, pentadecan, tetradecan, tridecan, dodecan, undecan, decan, DMSO, acetonitrile and butyl cellosolve.

The second non-aqueous solvent is a highly-volatile solvent having a vapor pressure of more than 3 torr at 25° C. As described above, the second non-aqueous solvent maintains a low viscosity and a good coatability on the roller together with the first non-aqueous solvent before coating of the ink composition, it is removed by evaporation to increase the viscosity of ink composition, and makes the pattern be formed and maintained on the roller.

The second non-aqueous solvent can be any solvent having a vapor pressure of higher than 3 torr and the examples are at least one or two volatile solvents selected from the group consisting of alcohol-based solvent, glycol ether-based solvent, glycol ether ester-based solvent, ketone-based solvent, hydrocarbon-based solvent, lactate-based solvent, ester-based solvent, aprotic sulfoxide-based solvent, and nitrile-based solvent which have a vapor pressure of higher than 3 torr at 25° C. The specific examples are at least one or two volatile solvents selected from the group consisting of methanol, ethanol, propanol, isopropanol, n-butanol, t-butanol, pentanol, hexanol, nonan octan, heptan, hexan, acetone, methylethylketone, methylisobutylketone, methyl cellosolve, ethylcellosolve, ethylene glycol dimethylether, ethylene glycol diethylether, propyleneglycol methylether acetate, chloroform, methylene chloride, 1,2-dichloroethane, 1,1,1-trichloroethan, 1,1,2-trichloroethan, 1,1,2-trichloroethene, cyclohexan, tetrahydrofuran, benzene, toluene and xylene.

Each first non-aqueous solvent and the second non-aqueous solvent can be contained at an amount of about 5 to 70 wt % and about 10 to 74 wt %, preferably about 20 to 50 wt % and about 25 to 55 wt %, and more preferably about 25 to 48 wt % and about 30 to 53 wt %, on the basis of total weight of other components in the composition except for the organic silver complex where the total weight of other components are sum of the weights of conductive metal powder, the first non-aqueous solvent, the second non-aqueous solvent, the coatability improving polymer, and optionally the surfactant When the amount of first non-aqueous solvent is small, or when the amount of second non-aqueous solvent is excessively large, the drying rate of ink composition becomes high after coating on the roller, thereby making the transfer be difficult. On the other hand, when the amount of the first non-aqueous solvent is larger than the ranges, or when the amount of the second non-aqueous solvent is excessively small, the low drying rate makes the entire process be delayed and makes it difficult to coat the ink composition.

The conductive metal ink composition includes the coatability improving polymer. The coatability improving agent acts as a binder in the ink composition and provides the adhesiveness, resulting in satisfactory coating and transferring of the ink composition in the preparation process of conductive pattern.

The coatability improving agent can be at least an adhesive polymer selected from the group consisting of epoxy-based polymer, phenol-based polymer, alcohol-based polymer. Examples of the epoxy-based polymer includes bisphenol A epoxy polymer, bisphenol F epoxy polymer, novolac epoxy resin, flame retarded epoxy resin such as bromo-epoxy resin, alicyclic epoxy polymer, rubber-modified epoxy resin, aliphatic polyglycidyl epoxy resin and glycidylamine epoxy polymer. The examples of phenol-based polymer are novolac phenol resin and resole phenol resin, and the examples of -based polymer are cellulosic polymer, polyvinylalcohol and ethylene vinyl alcohol. Besides, the examples of coatability improving polymer are ethylenevinylacetate, rosin-based resin, styrene-butadiene-styrene-based polymer, polyester-based polymer and etc.

Any material of the examples which are widely known or commercially-available materials, can be used as a coatability improving agent, and various polymers as well as the specific examples which has been used in the conductive ink composition can be used as a coatability improving agent.

Because the ink composition includes the coatability improving agent, the composition shows an excellent coatability on the roller, and a good transferring property to the substrate. Therefore, the ink composition can be applied for the roll printing method to form the fine conductive pattern.

The coatability improving agent can be contained in the ink composition at an amount of about 0.1 to 5 wt %, preferably about 1 to 4 wt %, or more preferably about 2 to 3 wt %, on the basis of total weight of other components in the composition except for the organic silver complex, where the total weight of other components are sum of the weights of conductive metal powder, the first non-aqueous solvent, the second non-aqueous solvent, the coatability improving polymer, and optionally the surfactant. If the amount is excessively small, the coatability and transferring property of ink composition are not sufficient. If the amount is excessively large, the conductive pattern of the ink composition cannot show sufficient conductivity.

Besides the components as described above, the conductive metal ink composition includes an organic silver complex where an organic ligand including amine group and hydroxyl group binds with a silver (Ag) salt of aliphatic carboxylic acid. The organic silver complex is prepared by binding an organic ligand selected from the group consisting of primary, secondary, tertiary and quaternary amines substituted with an alcohol group, with silver salt of aliphatic carboxylic acids. In addition, the silver salt of aliphatic carboxylic acid is selected from the group consisting of silver salts of primary or secondary fatty acid having C2 to C20. An equivalent ratio of the organic ligand to aliphatic carboxylic acid is 2:1 in organic silver complex.

The organic silver complex shows a low crystallinity due to the chemical complex type and an excellent solubility in solvent, resulting in the liquid-phase at room temperature. Since the organic silver complex can acts as a liquid-phase medium by itself, it reduces the amount of medium, namely non-aqueous solvent and increases the amount of conductive metal component such as conductive metal powder or silver included in the organic silver complex. Thus, the ink composition is applied for the roll printing method to form fine conductive pattern with an improved conductivity.

In addition, the organic silver complex includes the organic ligand and the silver salt of aliphatic carboxylic acid at an equivalent ratio of the organic ligand to the silver salt of aliphatic carboxylic acid of 2:1, which means two hydroxyl groups in a molecule, and thus shows high viscosity, for example, 50 to 2,000 cPs at room temperature (about 25° C.). The organic silver complex can function as a medium in the ink composition and thus, the ink composition can maintain excellent distribution stability even at low amount of non-aqueous solvent.

Because the ink composition includes the organic silver complex, higher density of conductive metal component and the conductive pattern with good conductivity can be obtained.

The examples of organic silver complexes which are disclosed in KR 2008-0029826A can be used for the ink composition of the present invention. As described in KR 2008-0029826A, the organic silver complex can be prepared by reacting the organic ligand with the silver salts of aliphatic carboxylic acid and the examples of solvent include methanol, terpineol, butyl carbitol acetate and etc.

The organic silver complex can be contained at an amount of about 0.1 to 5 parts by weight, preferably about 1 to 5 parts by weight, or more preferably about 3 to 5 parts by weight, with respect to 100 parts by weight of the conductive metal powder contained in the ink composition. If the amount gets small, the conductivity of the conductive pattern prepared from the ink composition is not sufficient. If the organic silver complex is contained excessively, the process is difficult to perform due to the increased viscosity of ink composition.

Besides the components in the ink composition, the composition can further include a surfactant. The surfactant contained in the ink composition prevents dewetting phenomenon and pinhole occurring, when the ink composition is coated on the roller. As a result, the ink composition can be coated favorably on the roller, so as to form the fine conductive pattern.

The silicon-based surfactant which has been used commonly in the conductive metal ink composition, for example, polydimethyl siloxane can be used as a surfactant, and other kinds of surfactants can be used for the present invention without any limitation.

The surfactant can be used at an amount of about 0.01 to 4 wt %, preferably about 1 to 4 wt %, or more preferably about 2 to 3 wt %, on the basis of total weight of other components in the composition except for the organic silver complex, where the total weight of other components are sum of the weights of conductive metal powder, the first non-aqueous solvent, the second non-aqueous solvent, the coatability improving polymer, and optionally the surfactant. Because the surfactant is contained in the ink composition in the ranges, the ink composition can be easily coated on the roller.

The conductive metal ink composition of the present invention has an initial viscosity of about 20 cPs or lower, preferably about 7 cPs or lower, or more preferably about 5 cPs or lower. Hereinafter, the term, "initial viscosity" means the viscosity while the ink composition is prepared initially and is coated on the roller. More specifically, the term, "initial viscosity" can means the viscosity of the ink composition that is stored after the preparation until the ink composition is coated. Namely, the viscosity is referred to the viscosity of the ink composition, before the ink composition is exposed to air and is coated on the roller. The conductive metal ink composition has such a low viscosity due to the inclusion of the first non-aqueous solvent and the second non-aqueous solvent, resulting in excellent coatability on the roller. After the ink composition is coated on the roller, the viscosity becomes high due to the evaporation of the second non-aqueous solvent with high volatility, thereby forming and maintaining the good pattern on the roller and transferring to the substrate.

If the initial viscosity is excessively high, it is difficult to control the pumping pressure and to obtain the good coatability on the roller, when the ink composition is coated on the roller. The ink composition must be leveled and form uniform film before the evaporation of the highly-volatile second non-aqueous solvent. If the initial viscosity is excessively high, it is difficult to level the ink composition and thus to coat the ink composition on the roller.

By applying the conductive metal ink composition for the roll printing method, the fine conductive pattern can be easily formed on the substrate. Particularly, the ink composition includes specific organic silver complex and thus, forms the conductive pattern with an excellent conductivity.

Therefore, the conductive metal ink composition can be printed on the substrate, for examples, a glass substrate according to the roll printing method, to form the conductive pattern, or preferably the electrode element of flat display element.

In accordance with an embodiment of the present invention, there is provided a method of preparing the conductive pattern. The method of forming a conductive pattern comprises the steps of: coating the conductive metal ink composition on a roller; forming a pattern of the ink composition corresponding to the conductive pattern on the roller by contacting the roller with a printing cliché which has an intaglio pattern corresponding to the conductive pattern; transferring the pattern of the ink composition on the roller onto a substrate; and sintering the transferred pattern on the substrate.

In the method of forming the conductive pattern, the term, "cliché" means the rough (凹凸) plate which is used to form conductive pattern in a desired shape by applying the ink composition on the roller. The intaglio pattern corresponding to the conductive pattern can be formed on in the cliché.

Figure 1:
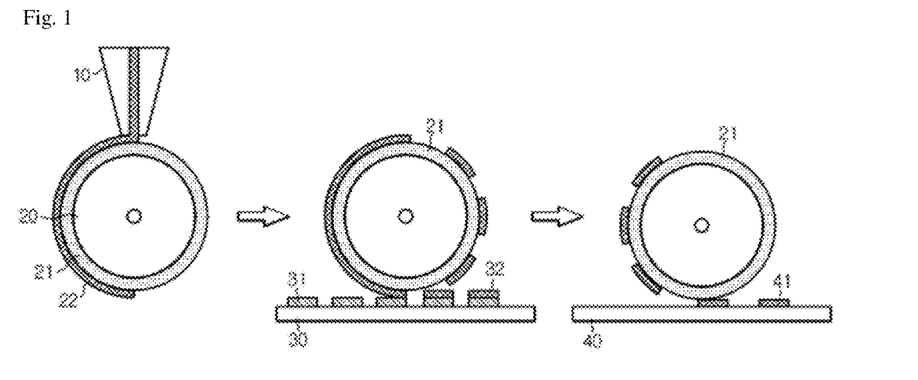
FIG. 1 is a schematic drawing showing a method of preparing the conductive pattern according to the roll printing method.

Referring to the attached drawings, the method of forming the conductive pattern according to the embodiment of the present invention will be described step by step. FIG. 1 is a schematic drawing to briefly show the steps of preparing the conductive pattern according to the roll printing method.

Firstly, the homogeneous ink composition can be prepared by mixing the components and agitating. To remove the impure materials and to form uniform conductive pattern, the ink composition can be further filtered.

Sequentially, the conductive ink composition (22) is coated on the roller (20). The outer surface of the roller (20) can be covered with blanket (21) which may comprise polydimethylsiloxane (PDMS). PDMS can be properly used as blanket (21), because it has better adhesiveness, and elastic, transforming and transferring properties than other polymers. The blanket (21) can be coated by the conductive ink composition which can be provided with an inflow hole (10) of an apparatus of providing the ink composition. At this time, as the second non-aqueous solvent begins to evaporate, the viscosity of ink composition (22) increases sharply.

After coating the ink composition (22) on the blanket (21), the pattern of the ink composition corresponding to the conductive pattern is formed on the roller by contacting the roller with a printing cliché having the intaglio pattern corresponding to the conductive pattern.

That is, the cliché (30) removes selectively the ink (32) which need not for pattern formation, by contacting with the blanket (21) coated with the ink composition (22), resulting in preparing a desired pattern on the roller corresponding to the conductive pattern. To do so, the cliché (30) has the intaglio pattern corresponding to the conductive pattern on its surface contacting with the blanket (21). Only protruding part (31) of the cliché (30) contacts with the ink composition (22) on the blanket (21), and transfers the ink (32) to the protruding part (31), resulting in removing the ink which is not required to form the conductive pattern.

After forming the pattern of ink composition on the roller, the pattern is transferred to the substrate. The pattern of ink composition is transferred to the substrate (40) by contacting the blanket (21) which the pattern of ink composition is formed on, with the substrate (40) to form desired pattern (41) on the substrate (40).

After transferring step, the conductive pattern on the substrate can be formed by sintering. The sintering step can be performed under the proper conditions that are dependent on the kind of desired conductive pattern. For example, in case that the conductive pattern is used for an electrode pattern of flat display device, the sintering step can be carried out at about 300 to 600° C. for about 5-50 minutes. particularly at about 400 to 480° C. for 10 to 40 minutes.

According to the method of preparing the conductive pattern using the roll printing method, the conductive pattern can be formed rapidly and simply on the substrate, compared with photolithography used in the prior art. As the ink composition is applied to the roll printing method, it is easy to form the fine conductive pattern with an excellent conductivity, for example, the electrode pattern of flat panel display device.

Advantage Effect

As described above, the present invention provides a conductive metal ink composition which can be properly applied for roll printing process to form a conductive pattern. In addition, the conductive pattern with excellent conductivity can be prepared by using the conductive metal ink composition.

Therefore, by applying the conductive metal ink composition to the roll printing method, it is possible to prepare a fine conductive pattern, for example, a fine electrode pattern of flat panel display element.

EXAMPLES

The present invention is further explained in more detail with reference to the following examples. These examples, however, should not be interpreted as limiting the scope of the present invention in any manner.

Example 1

Conductive Metal Ink Composition and Formation of Conductive Pattern 8.57 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin as a phenol polymer were mixed and agitated for 12 hours. 5 wt % of silver (Ag)(hexanoate)(diethanolamine)$_2$ on the basis of weight of silver nanoparticle was added to the resulting solution, agitated for 12 hours, and filtered with a filter having a pore size of 1 μm to prepare the ink composition. The initial viscosity of the ink composition was measured according to the following method, and was 4.02 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Example 2

Conductive Metal Ink Composition and Formation of Conductive Pattern 6.67 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin as a phenol polymer were mixed and agitated for 12 hours. 5 wt % of silver (Ag)(hexanoate)(diethanolamine)$_2$ on the basis of weight of silver nanoparticle was added to the resulting solution, agitated for 12 hours, and filtered with a filter having a pore size of 1 μm to prepare the ink composition. The initial viscosity of the ink composition was measured according to the following method, and was 3.63 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Example 3

Conductive Metal Ink Composition and Formation of Conductive Pattern 6.67 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin of phenol polymer were mixed and agitated for 12 hours. 5 wt % of silver (Ag)(propionate)(diethanolamine)$_2$ on the basis of weight of silver nanoparticle was added to the resulting solution, agitated for 12 hours, and filtered with a filter having a pore size of 1 μm to prepare the ink composition. The initial viscosity of the ink composition was measured according to the following method, and was 2.97 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Example 4

Conductive Metal Ink Composition and Formation of Conductive Pattern 6.67 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin of phenol polymer were mixed and agitated for 12 hours. 5 wt % of silver (Ag)(stearate)(diethanolamine)$_2$ on the basis of weight of silver nanoparticle was added to the resulting solution, agitated for 12 hours, and filtered with a filter having a pore size of 1 μm to prepare the ink composition. The initial viscosity of the ink composition was measured according to the following method, and was 3.29 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Example 5

Conductive Metal Ink Composition and Formation of Conductive Pattern 6.67 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin of phenol polymer were mixed and agitated for 12 hours. 5 wt % of silver (Ag)(hexanoate)(2-methoxyethylamine)$_2$ on the basis of weight of silver nanoparticle was added to the resulting solution, agitated for 12 hours, and filtered with a filter having a pore size of 1 μm to prepare the ink composition. The initial viscosity of the ink composition was measured according to the following method, and was 2.68 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Example 6

Conductive Metal Ink Composition and Formation of Conductive Pattern 6.67 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin of phenol polymer were mixed and agitated for 12 hours. 5 wt % of silver (Ag)(hexanoate)(2-methylaminoethanol)$_2$ on the basis of weight of silver nanoparticle was added to the resulting solution, agitated for 12 hours, and filtered with a filter having a pore size of 1 μm to prepare the ink composition. The initial viscosity of the ink composition was measured according to the following method, and was 2.83 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Example 7

Conductive Metal Ink Composition and Formation of Conductive Pattern 6.67 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin of phenol polymer were mixed and agitated for 12 hours. 5 wt % of silver (Ag)(hexanoate) (triethanolamine)$_2$ on the basis of weight of silver nanoparticle was added to the resulting solution, agitated for 12 hours, and filtered with a filter having a pore size of 1 μm to prepare the ink composition. The initial viscosity of the ink composition was measured according to the following method, and was 4.05 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Comparative Example 1

Conductive Metal Ink Composition and Formation of Conductive Pattern 6.67 g of silver nanoparticle having an average diameter of 50 nm, 2.3 g of methyl cellosolve (vapor pressure of 6.2 torr at 25° C.), 7 g of ethanol (vapor pressure of 59.3 torr at 25° C.), 10 g of butyl cellosolve (vapor pressure 0.76 torr at 25° C.), 0.2 g of polydimethylsiloxane surfactant, and 0.7 g of phenol aldehyde novolac resin of phenolic polymer were mixed and agitated for 12 hours. The resulting solution was filtered with a filter having a pore size of 1 μg to prepare the ink composition. The initial viscosity of the ink composition was measured according to the following method, and was 2.93 cPs.

The PDMS blanket of roller was coated with the ink composition, and was contacted with cliché having an intaglio pattern corresponding to the desired conductive pattern to form the pattern of ink composition on the roller. Then, the pattern on the roller was transferred onto the glass substrate by contacting the roller with the glass substrate, and sintered at 450° C. for 30 minutes in thermal furnace to obtain the conductive pattern.

Reference 1

Preparation of an Ink Composition with High Viscosity 7.5 g of silver nanoparticle having an average diameter of 16 nm, 2.6 g of methyl cellosolve (vapor pressure of 6.2 torr at 25° C.), 7.7 g of ethanol (vapor pressure of 59.3 torr at 25° C.), 9.9 g of propyl cellosolve (vapor pressure 0.975 torr at 25° C.), 0.8 g of N-methylpyrrolidone (vapor pressure of 0.375 torr at 25° C.), 0.2 g of polydimethylsiloxane surfactant, and 0.7 g of phenol aldehyde novolac resin of phenol polymer were mixed and agitated for 12 hours. The resulting solution was filtered with a filter having a pore size of 1 μm to prepare the ink composition. The initial viscosity of the ink composition was measured according to the following method, and was 128 cPs.

Reference 2

Preparation of an Ink Composition with High Viscosity 6.0 g of silver nanoparticle having an average diameter of 16 nm, 6.1 g of methyl cellosolve (vapor pressure of 6.2 torr at 25° C.), 11.4 g of propyl cellosolve (vapor pressure 0.975 torr at 25° C.), 0.5 g of N-methylpyrrolidone (vapor pressure of 0.375 torr at 25° C.), 0.2 g of polydimethylsiloxane surfactant, and 0.7 g of phenol aldehyde novolac resin of phenol polymer were mixed and agitated for 60 hours. The resulting solution was filtered with a filter having a pore size of 1 μm to prepare the ink composition. The initial viscosity of the ink composition was measured according to the following method, and was 34 cPs.

Test Example 1

Measurement of Initial Viscosity of the Conductive Ink Composition

The initial viscosity of the ink compositions obtained in Examples 1 to 7, Comparative Example 1, and References 1 and 2 were measured by using Brookfield viscometer and was shown as above.

Test Example 2

Test of Conductive Pattern Properties

Figure 2:
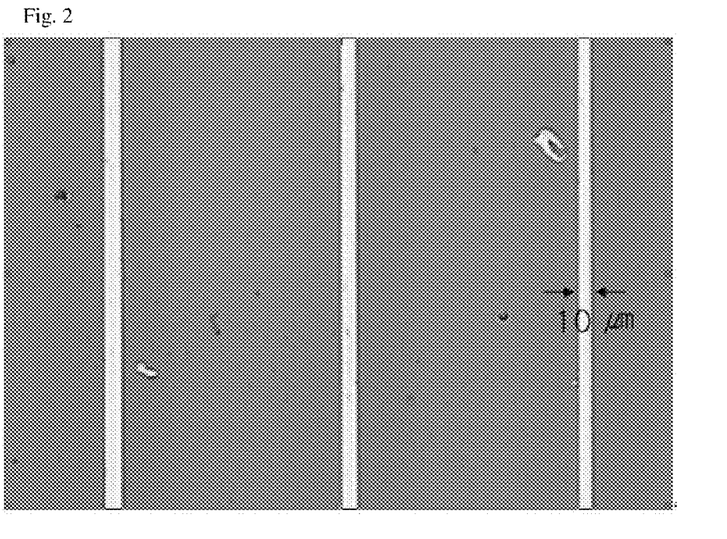
FIG. 2 is a microscopic image of the conductive pattern obtained in Example 1.

The conductive pattern obtained in Example 1 was observed with a light microscope (Nikon, Eclipse 90i) and the microscopic image was shown in FIG. 2. FIG. 2 confirmed that the conductive pattern with line width of about 10 μm was satisfactorily formed by using the ink composition of Example 1. On the other hand, the ink composition having an initial viscosity of higher than 10 cPs obtained in References 1 and were not even able to be coated on the roller.

Figure 3:
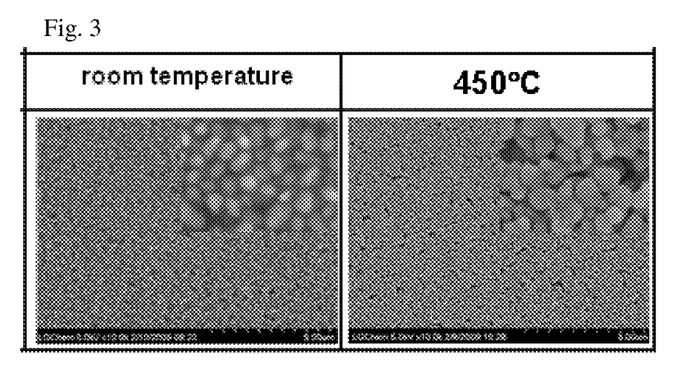
FIG. 3 is a SEM image of fine structure of the conductive pattern obtained in Example 1.
Figure 4:
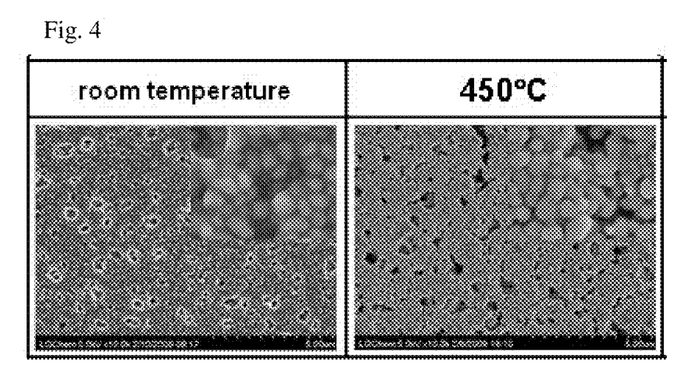
FIG. 4 is a SEM image of fine structure of the conductive pattern obtained in Comparative Example 1.

Before and after sintering the conductive patterns prepared from the ink compositions of Example 1 and Comparative Example 1, the sintered patterns were observed with an electron microscope (HITACHI, S-4800) and shown in FIGS. 3 and 4. FIGS. 3 and 4 confirmed that the conductive pattern of Example 1 included the conductive metal component (silver) at higher density than that of Comparative Example 1.

The conductivity of each conductive pattern obtained in Examples 1, 2, 5 to 7 and Comparative Example 1 was tested by measuring the specific resistance of the conductive pattern. The specific resistance was calculated by multiplying the sheet resistance measured by 4 point probe (Mitsubishi chemical, MCP-T600) and the thickness measured by using alpha step. The obtained specific resistance was represented in Table 1.

TABLE 1

|  | Specific Resistance (μΩ · cm) |
| --- | --- |
| Example 1 | 9.80 |
| Example 2 | 4.50 |
| Example 5 | 17.29 |
| Example 6 | 13.31 |
| Example 7 | 15.92 |
| Comparative Example 1 | 79.60 |

Referring to Table 1, the conductive patterns of Examples 1, 2, 5, 6 and 7 showed very low specific resistance and excellent conductivity due to the inclusion of organic silver complex. However, it was confirmed that the conductive pattern of Comparative Example 1 had high specific resistance and low conductivity.

The invention claimed is:
1. A method for forming a conductive pattern, comprising the steps of:

coating a conductive metal ink composition on a roller;

forming a pattern of the ink composition corresponding to the conductive pattern on the roller, by contacting the roller with a cliché which has intaglio pattern corresponding to the conductive pattern;

transferring the pattern of the ink composition on the roller onto a substrate; and sintering the transferred pattern on the substrate, wherein the conductive metal ink composition comprises:
- a conductive metal powder;
- an organic silver complex where an organic ligand including amine group and hydroxyl group binds with a silver (Ag) salt of aliphatic carboxylic acid;
- a non-aqueous solvent comprising a first non-aqueous solvent having a vapor pressure of 3 torr or lower at 25° C. and a second non-aqueous solvent having a vapor pressure of higher than 3 torr at 25° C.; and
- a coatability improving polymer.

2. The method for forming a conductive pattern of claim 1, wherein the conductive pattern is an electrode pattern of flat panel display device.

\* \* \* \* \*